US007760046B2

(12) United States Patent
Tilford et al.

(10) Patent No.: US 7,760,046 B2
(45) Date of Patent: Jul. 20, 2010

(54) COUPLER TO C-PATHWAY DEVICE AND METHODOLOGY

(76) Inventors: Arthur Robert Tilford, 5975 Calle Entrada, Yorba Linda, CA (US) 92887-3532; Philip Zimmermann, 3665 E. First St., #304, Long Beach, CA (US) 90803

( * ) Notice: Subject to any disclaimer, the term of this patent is extended or adjusted under 35 U.S.C. 154(b) by 359 days.

(21) Appl. No.: 11/982,949

(22) Filed: Nov. 5, 2007

(65) Prior Publication Data

US 2008/0106352 A1 May 8, 2008

Related U.S. Application Data

(60) Provisional application No. 60/857,080, filed on Nov. 6, 2006.

(51) Int. Cl.
*H03H 7/38* (2006.01)
*H01P 3/06* (2006.01)

(52) U.S. Cl. ........................................ 333/34; 333/243

(58) Field of Classification Search ................... 333/34, 333/236, 237, 243, 244
See application file for complete search history.

(56) References Cited

U.S. PATENT DOCUMENTS 5,552,753 A * 9/1996 Agarwal et al. ............... 333/33
6,717,493 B2 * 4/2004 Chopra et al. ............... 333/237

* cited by examiner

*Primary Examiner*—Dean O Takaoka

(57) ABSTRACT

The invention is an electromagnetic wave or "EM" coupler for successfully connecting EM waves between an EM generator output and a conductive pathway or "c-pathway" that is not normally considered as an EM transmission medium or line. The coupler includes a dual surface shell-like structure with an electrically conductive outer surface that is insulated from an electrically conductive inner surface that is attached at a specified location along a c-pathway. The forward end of the inside surface of the coupler is attached to the c-pathway while the outside surface of the forward end of the coupler is left unconnected and open. To provide a successful EM connection between the coupler and the c-pathway, the physical size of the coupler is configured as a physically shaped component with a relationship to the c-pathway itself rather than to the particular EM wave required to make such connectivity. To facilitate a realistic physical coupler structure, an additional impedance matching system is coupled between the EM wave generator output and the coupler itself. The EM generator is appropriately connected to an impedance tuning network whose output is then electrically connected to the coupler with the ground component connected to the rearward end of the outside surface of the coupler while the active component is connected to the inside surface of the rearward end of the coupler.

8 Claims, 5 Drawing Sheets

COUPLER TO C-PATHWAY DEVICE AND METHODOLOGY

PRIOR APPLICATIONS

This application is based on provisional application No. U.S. 60/857,080 filed Nov. 6, 2006 and claim is made for the benefit of the filing date of the provisional application.

FIELD OF THE INVENTION

The invention is an electromagnetic wave (EM) coupler for successfully connecting EM waves between an EM generator output such as the primary or secondary of an EM matching transformer and a conductive pathway or "c-pathway" that is not normally considered as an EM transmission medium or line.

BACKGROUND OF THE INVENTION

This invention relates to the coupling of electromagnetic waves between a radio frequency or electromagnetic energy source and a c-pathway (conducting pathway) not normally used for the movement of radio frequency waves. Such c-pathways are entities which include any system that has a geometrically defined continuous conducting structure hereafter referred to as a "c-pathway." Such a c-pathway would include, for example, pipelines, metal fences, and railroad tracks where the longitudinal members of the c-pathway are geometrically defined with a specific cross sectional dimension and a specific longitudinal distance, are conductive, and at least, partially isolated from nearby parallel structures of a closely related nature.

More specifically, this invention relates to the coupler mentioned in and required by the system described in a previous patent application known as "Security detection system and methodology using any existing c-pathway for sensing and communication" and referenced by application No. 60/840,535, filed Aug. 28, 2006.

SUMMARY OF THE INVENTION

This invention is based upon the relationship between the physical world and structures within and the non-physical world of electromagnetic energy which can be controlled from within physical world structures. For example, electrical energy in the form of a specific voltage is found within most residences and commercial buildings. The portal for this energy is a physical two or three pronged female type plug. Physical appliances may receive the electrical energy required by simply being attached to one of these electrical plugs within the building. Yet, the real source of this energy is not part of the physical environment and is normally not within the building itself, but can be hundreds of miles away at a generating source.

Metal cables carry this electrical energy from the generated source to its final destination. These metal cables are part of the physical world. They have weight and dimensions and are made of specific materials, all physical world components. The generator itself is defined as a physical world entity. Yet, when the system is in operation, an invisible energy force known as electromagnetic energy, or electricity is formed. The travel of this energy is controlled by the direction of the cables. So we have unseen energy being controlled by real world components.

The electricity or electromagnetic energy generated within the United States has been standardized as an alternating current with an operating frequency of 60 Cycles-per-second (Hertz). The cables carrying this energy are known as transmission lines. The energy travels at or near the speed of light which is 300,000 kilometers per second. A formula for determining the exact length of a single wave at 60 Hz is calculated using the distance light travels and is the relationship between the frequency and the length of the wave:

Wavelength=300,000 kilometers per second divided by 60 cycles per second

The length of the wave is therefore 5,000 kilometers long.

The frequency of operation for this device will be between 1,000 Cycles-per-second (Hertz) and 10,000 Cycles-per-second (Hertz). A cycle-per-second is known as a Hertz which is abbreviated "Hz.". One thousand Hz. are known as One Kilo-Hertz or 1 KHz. When using the formula for wavelength, and we would like to calculate the longest wave which this coupler must operate at, we have the following:

Wavelength=300,000 kilometers-per-second divided by 1,000 cycles-per-second.

The length of the wave is 300 kilometers long. This is the longest wave which this coupler must pass into a c-pathway. The shortest wave, that can be passed, is 30 kilometers long. We discovered this using the formula or simply dividing the longest wave by ten since we have made a ten times jump in frequency which reduces the physical length of the wave by a factor of ten.

Simple open cables such as those used in 60 Hz. transmission lines can accommodate the travel of very long energy waves without being fenced or enclosed since the actual cable length is a fraction of the wavelength. As a transmission cable length approximates that of the wavelength, it acts as an antenna and unless this cable is fenced or surrounded by a shield, the energy will be lost or radiated into the surrounding atmosphere. This works to advantage where an antenna is desired, but where the energy must not be lost it is a decided disadvantage.

EM waves are generated by a device known as an oscillator. This oscillator is known as a transmitter when the oscillator is in a system with associated devices such as amplifiers and modulators and controllers. The generated EM waves must be transported to an antenna or another entity through a type of conduit. Such a conduit is known as a waveguide.

Extremely high frequency electromagnetic waves called microwaves can travel within a waveguide without relying on a central conducting wire. Waveguides can accomplish their tasks due to the fact that the distance between the interior surface of the wave shield is equal to or less than the length of the actual wave traveling within it. As the length of the wave increases, the geometric size of a waveguide must also increase until such a waveguide becomes impractical. To accomplish the travel of an electromagnetic wave along a conducting wave path without losing much of the wave energy, a central wave carrying pathway or wire is required. Such a system is known as a coaxial wave carrier or a coaxial cable.

Coaxial cables have specific impedances, which are defined by the materials that they are made of and the geometry of the cable components. When such coaxial cables are used to connect devices together, the devices to be connected must also have the same or matching impedance as the cable. Such devices may be transmitters, antennas, receivers, and sub-components within these entities.

So that the least amount of energy is lost when the transfer of EM energy is made between the transmitter and the EM energy carrying cable, a matching network must be introduced at the connection. Such a matching network may include several components including inductors, capacitors and transformers.

When the energy transfer is to be made to a non-defined c-pathway, the matching network must also include a special coupler. This coupler then provides the transition of the EM energy from the transmitter, through the matching network components to the c-pathway. The EM waves then move along and above the surface of the c-pathway. The EM waves traveling along or above the c-pathway surface are referred to as surface waves.

There are EM transmission line systems which do not use coaxial cable, but rather appear to be a single wire strung between the large open end of two funnels much like a child's tin-can telephone where a string is connected between the open ends of two tin-cans. The funnel-like device is known as a surface wave launcher. This reference is made to the fact that the funnel-like structure looks as if it can eject or launch out energy. Such a device is also used to make the appropriate electromagnetic match so that a minimum of energy is lost. In such a surface wave launcher, the surface wave transmission line is like the center conductor of the coaxial cable with the funnel shaped launcher acting as the shield of the coaxial cable. Thus, instead of using a coaxial cable to carry EM waves, a single wire is used which has, what appears to be, an invisible shield around it.

There is much prior art associated with this type of transmission system, which is generally used at higher frequencies. For example, U.S. Pat. No. 2,852,753, U.S. Pat. No. 2,938,179 U.S. Pat. No. 3,320,556 and U.S. Pat. No. 4,730,172 all demonstrate a surface wave launcher, which is used with a specific and known transmission line or cable. These launchers are so highly restrictive that their use with an undefined c-pathway is impossible.

The present invention will utilize a combination of a tuning circuit known as the network impedance system and a method of attaching the impedance system to any c-pathway with the least amount of reflectance or wave travel restriction at the attachment point. The physical geometry of the attaching coupler is small compared to the wave size because the coupler advantage is limited to an impedance match of less than or equal to one-ohm and the bandwidth expected is less than or equal to one octave. The bulk of the impedance matching is accomplished by the associated network impedance system. Physically, the coupler is dimensioned from the size of the network impedance system inductor wire size at the coupler small end to the physical dimension of the c-pathway with a maximum ratio of 100:1.

BRIEF DESCRIPTION OF THE DRAWINGS

These and other features and advantages of the invention will be understood more fully after reading the following description taken together with the accompanying drawings in which.

DETAILED DESCRIPTION

Figure 1:
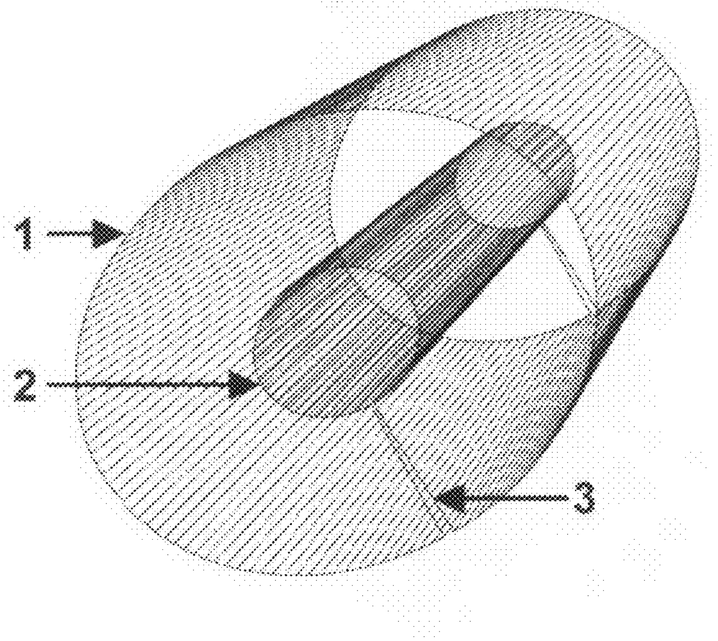
FIG. 1 is an isometric view of a coaxial system with an inner conductive shell surrounded by, and parallel to, an outer conductive shell with both end diameters equal thus forming a closed cylindrical structure.

The present invention provides a method of transferring very low frequency energy from an impedance-defined system to a random and non-defined c-pathway. The c-pathway may or may not be grounded and may have a ground to c-pathway impedance variance of from less than one-ohm to tens of ohms. The c-pathway is defined by its length geometry and will be within at least ten-percent of a wavelength. Confined traveling electromagnetic wave energy is commonly pathed within a coaxial system. Such a system is demonstrated in FIG. 1 with a centrally located wave pathway (2) surrounded by a wave shield (1) with an insulating support (3). Regardless of length, if the distance between the central wave carrier (2) and the outer wave shield (1) remains consistently equal and the material separating the two remain consistent throughout, the impedance throughout the entire length will remain the same. Such a coaxial system appears as a cylinder within a cylinder with parallel sides. Should the distance between the central wave pathway and the outer shield were to change, the system would no longer appear as parallel cylinders and the impedance at that point would change.

Figure 2:
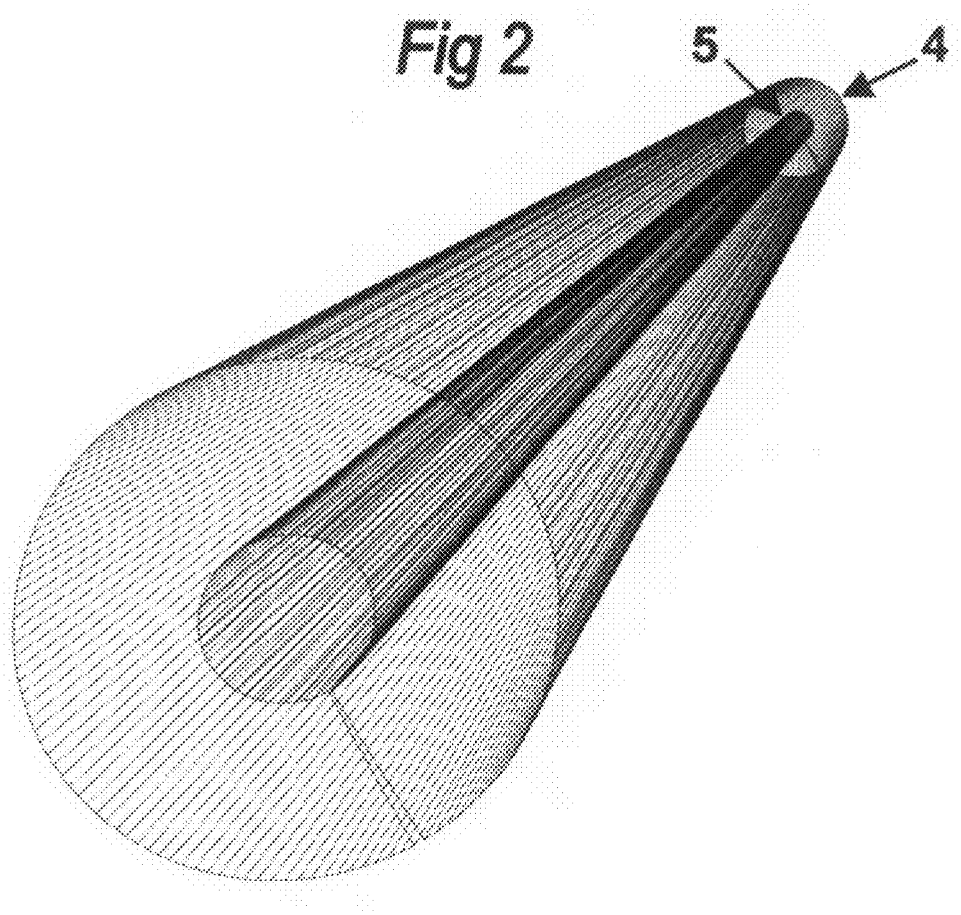
FIG. 2 is a coaxial system with an inner conductive shell surrounded by, and parallel to, an outer conductive shell with one end having a greatly diminished diameter thus forming a closed cone structure.

If a defined length of the coaxial system were altered into the form of a cone rather than a cylinder, the impedance from one end to the other would vary. Such a system consisting of two cones, one inside the other and having parallel sides is demonstrated in FIG. 2. The smaller end still contains the central wave pathway (5) and the surrounding outer shield (4). The impedance from one end top the other is not the same, but varies from a lower to higher impedance.

Figure 3:
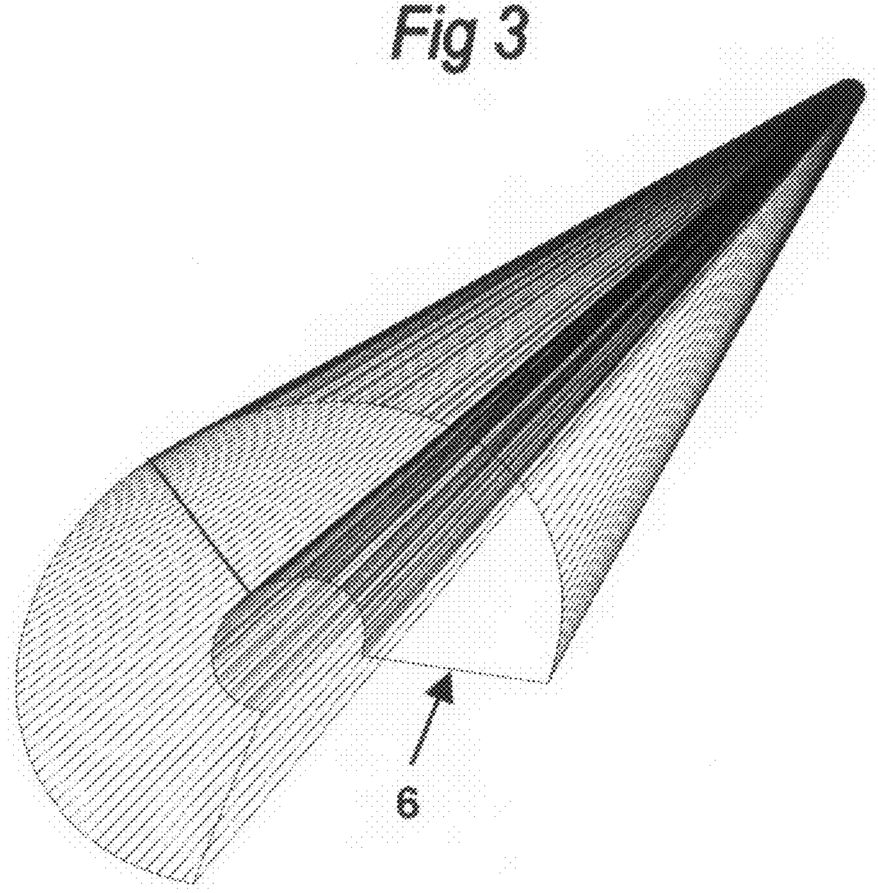
FIG. 3 is a coaxial system with a circular inner conductive shell partially surrounded by, and parallel to, a circular outer conductive shell with one end having a greatly diminished diameter thus forming a greater than 180-degree open cone structure.

FIG. 3 is an isometric view of the coned coaxial system having a cut-away conic section along the conic axis of more than 1-degree and less than 180-degrees. Regardless of the size of section removed, an insulating support (6) between the central wave pathway and the outer surrounding shield must exist. Such a support is required to maintain the required and parallel distance between the two components. This insulating structure may be single columns or may be composed of an insulating substance entirely filling the parallel space.

Figure 4:
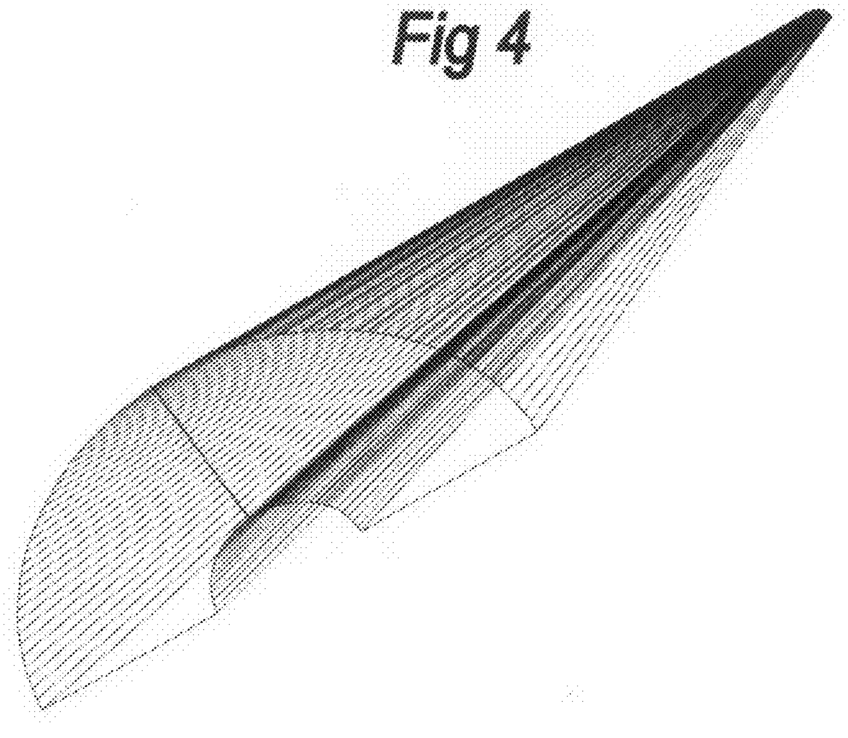
FIG. 4 is a coaxial system with a circular inner conductive shell partially surrounded by, and parallel to, a circular outer conductive shell with one end having a greatly diminished diameter thus forming a 180-degree open cone structure.

FIG. 4 is an isometric view of the same coaxial conic system with 180-degrees of cone removed along the conic axis. This half conic section maintains the same dimensions as if it were a full conic as the distances between the central wave carrier and the outer wave shield remain consistently parallel, from one end to the other.

Figure 5:
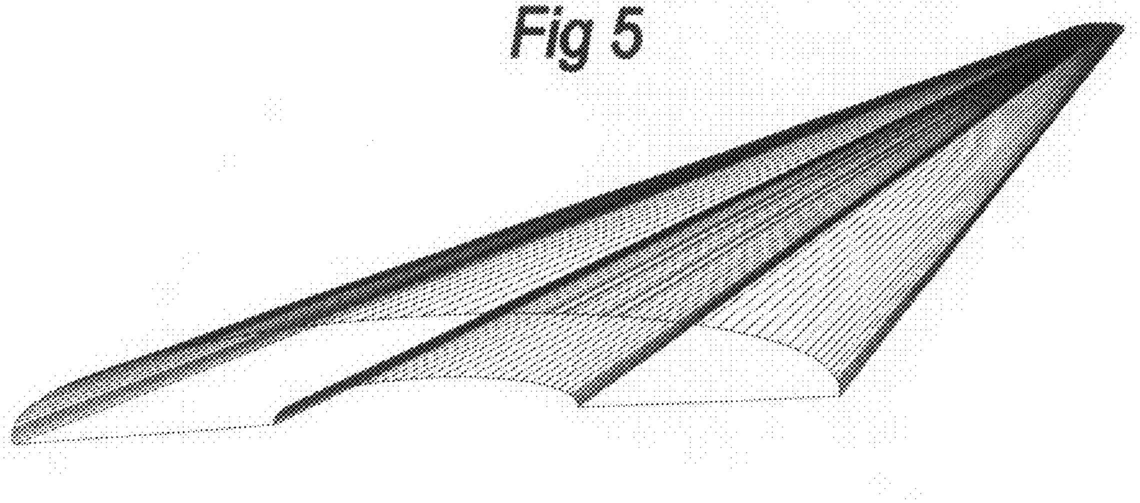
FIG. 5 is the same as FIG. 4 with the inner conductive shell and outer conductive shell greatly flattened.

FIG. 5 is an isometric view of the same coaxial system as in FIG. 4 except that the coaxial conic dimension is now flattened. The central wave pathway remains parallel to the outer shield, but the radius is not the same throughout.

Figure 6:
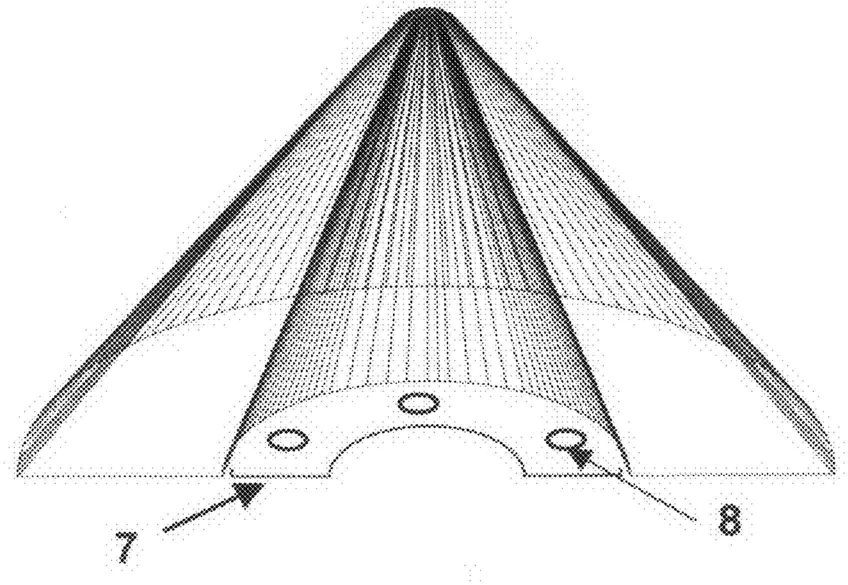
FIG. 6 is the same as FIG. 4 with the addition of an attachment and conductive support structure added to the inner conductive shell at the larger end.

FIG. 6 is a head-on isometric view of the coaxial conic system with an attached end piece (7) for the purpose of bolting onto a cylindrical c-pathway of similar diameter using pre-stamped bolt ports (8).

Figure 7:
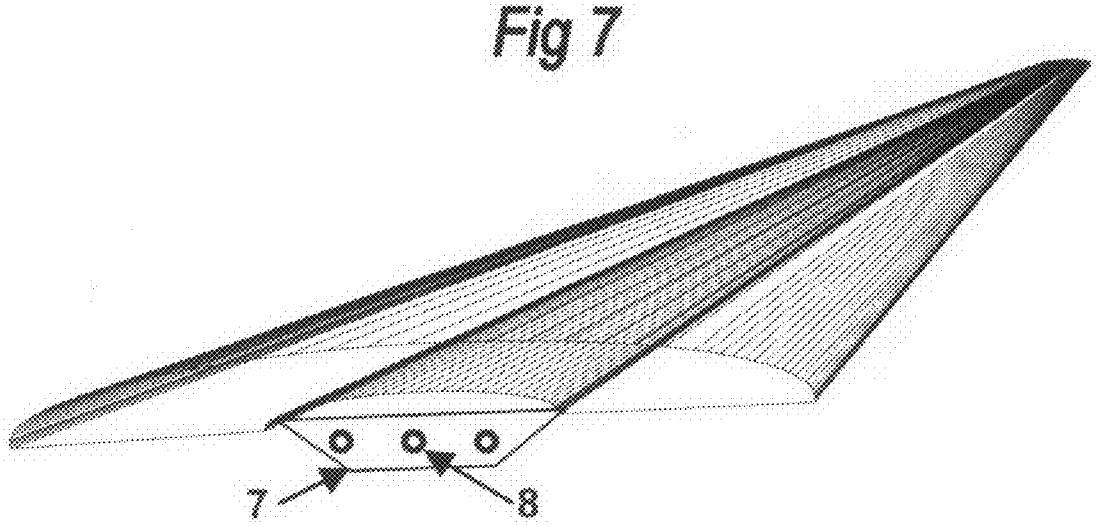
FIG. 7 is the same as FIG. 5 with the addition of an attachment and conductive support structure added to the inner conductive shell at the larger end.

FIG. 7 is the same as FIG. 4 with an attached end piece (7) for the purpose of bolting onto a flat c-pathway of similar size using pre-stamped bolt ports (8).

Figure 8:
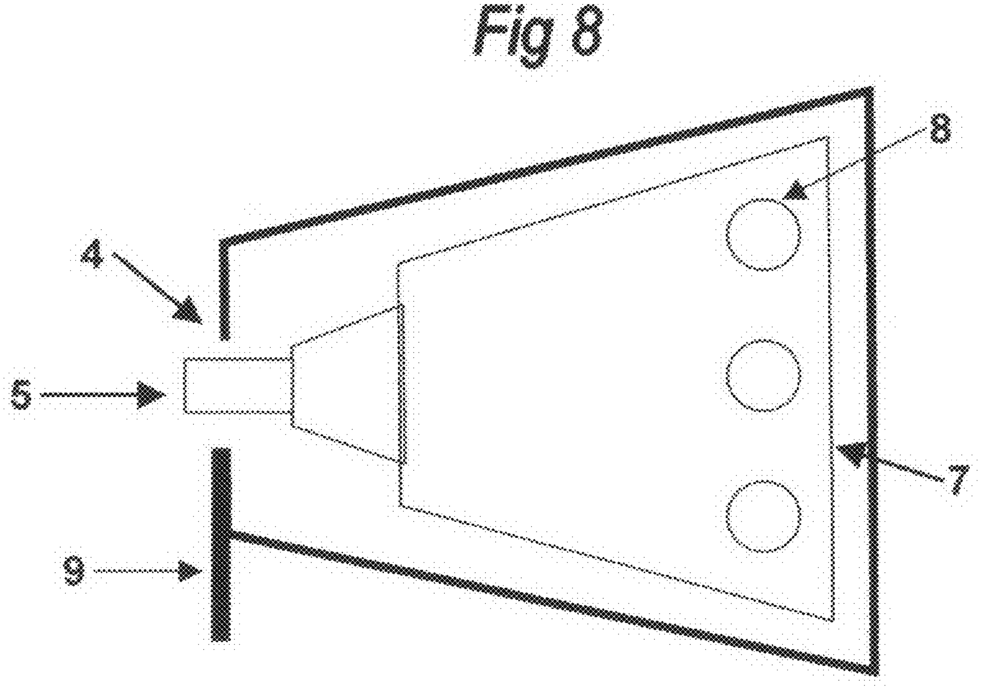
FIG. 8 is a geometric presentation of the coaxial coupler for attachment to a c-pathway.

Thus it can be seen that the coupler is a coaxial system composed of geometry in the form of a set of cones, one inside the other, and insulated from each other with the ability to attach the larger end to a c-pathway of certain dimensions and shape by way of a set of physical bolts. FIG. 8 represents this approach and is a 2D side view of such an arrangement. The smaller end of the coupler outer wave shield (4) has a physical electrical port (9) for network impedance system connectivity at ground potential. Connectivity directly to the network system impedance inductor is made at the smaller end inner conductive wave pathway (5). The coupler is attached at the larger end using the central wave path attachment adapter (7) and the bolt ports (8).

Figure 9:
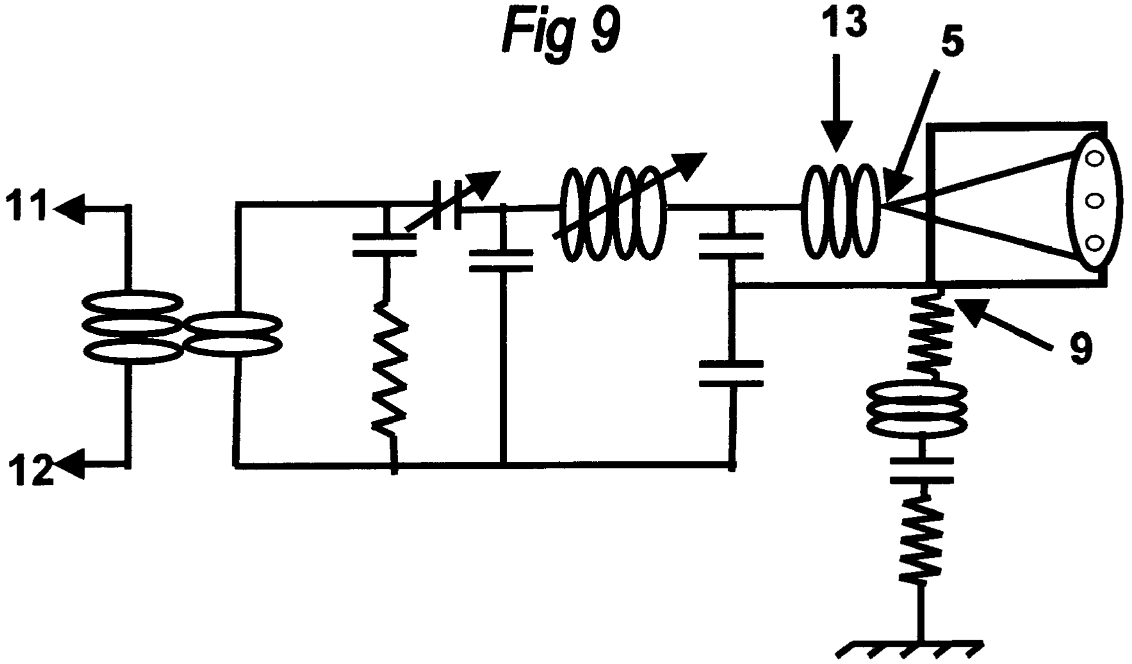
FIG. 9 is a schematic of coupler and associated impedance matching network.
Figure 10:
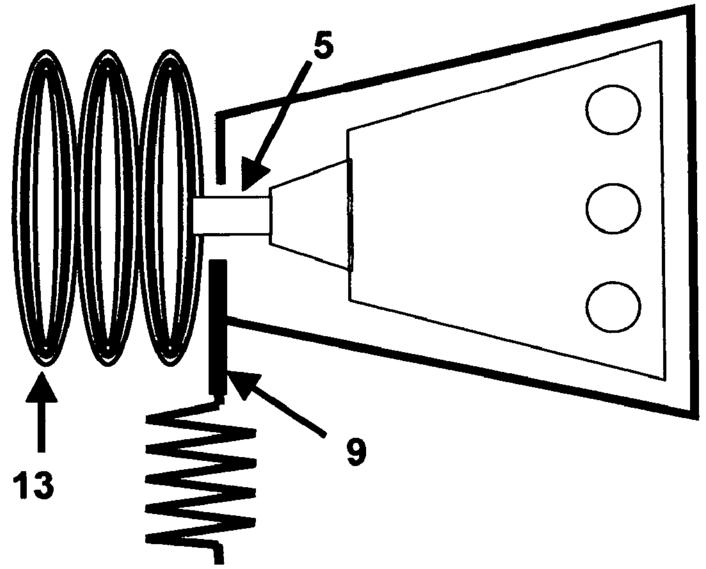
FIG. 10 is a pictorial representation of the coupler as attached to network matching system inductor.

FIG. 9 is a schematic diagram of the network impedance matching system where the transmitter or electromagnetic energy source is attached to the primary of the matching transformer at 11, and 12. The output inductor (13) is connected to the coupler at 5 and the ground portion of the circuit is attached to the outer wave shield at 9. This is also demonstrated in FIG. 10 with a 2D side view of the network impedance system output inductor (13) as attached to the inner wave path conductor (5) and the circuit ground potential attached at 9.

The present invention will utilize a combination of a tuning circuit known as the network impedance system and a method of attaching the impedance system to any c-pathway with the least amount of reflectance or wave travel restriction at the attachment point. The physical geometry of the attaching coupler is small compared to the wave size because the coupler advantage is limited to an impedance match of less than or equal to one-ohm and the bandwidth expected is less than or equal to one octave. The bulk of the impedance matching is accomplished by the associated network impedance system.

Physically, the coupler is dimensioned from the size of the network impedance system inductor wire size at the coupler small end to the physical dimension of the c-pathway with a maximum ratio of 100:1 and a minimum ratio of 10:1. The coupler size is determined by the dimensions of the c-pathway. If the c-pathway is cylindrical in shape, such as a pipe, then the dimension required at the coupler attachment bracket, as in FIG. 6 (7) is the diameter of the pipe. The small end then becomes the size of the inductor as long as the ratio falls between 10:1 and 100:1 as stated above. If the c-pathway is a flat surface, then the dimension required for attachment is a practical size falling anywhere between the 10:1 and 100:1 ratio as defined above.

The distances between the inner and outer components of the coupler and the material of insulation are determined by mathematical analysis for wave propagation within a medium and are known within prior art.

That which is claimed is:

1. A method of constructing a device:

uniquely suited for coupling very low frequency electromagnetic waves onto elongated conductive pathways;

with an operating frequency range from 1,000 Hz. to 10,000 Hz.;

with electrically conductive active surfaces;

whose physical size and shape is input to output dimensioned with a maximum ratio of 100:1 and a minimum ratio of 10:1.

2. A method of constructing a device in accordance with claim 1 that is generally dual concentric in nature with both surfaces parallel to one another such as a cylinder within a cylinder, a rectangle within a rectangle or a cone within a cone.

3. A method of constructing a device in accordance with claim 1 whose said electrically conductive active surfaces are composed of an inner and outer electrically conductive surface which are electrically separate from one another with non-conductive insulating material.

4. A method of constructing a device in accordance with claim 3 whose said inner surface forward end is attached to the conductive pathway.

5. A method of constructing a device in accordance with claim 3 whose said outer conductive surface's forward end is left open and unconnected.

6. A method of constructing a device in accordance with claim 3 whose said inner conductive surface's rearward end is connected to the active component of an impedance tuning network.

7. A method of constructing a device in accordance with claim 3 whose outer conductive surface's rearward end is connected to the ground component of an impedance tuning network.

8. A method of constructing a device in accordance with claim 3 where the distances between the said inner and said outer conductive surfaces and the said non-conductive insulating material used are determined by mathematical analysis for wave propagation within a medium.

* * * * *